United States Patent
Nishinohara et al.

(10) Patent No.: US 9,537,013 B2
(45) Date of Patent: Jan. 3, 2017

(54) DISPLAY DEVICE INCLUDING TAPERED SUBSTRATE

(71) Applicant: Japan Display Inc., Tokyo (JP)

(72) Inventors: Takuma Nishinohara, Tokyo (JP); Toshihiko Itoga, Tokyo (JP); Norio Oku, Tokyo (JP); Yasukazu Kimura, Tokyo (JP); Jun Fujiyoshi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/665,881

(22) Filed: Mar. 23, 2015

(65) Prior Publication Data

US 2015/0280172 A1    Oct. 1, 2015

(30) Foreign Application Priority Data

Mar. 31, 2014  (JP) ................. 2014-071652

(51) Int. Cl.
| | |
|---|---|
| *H01L 29/08* | (2006.01) |
| *H01L 29/786* | (2006.01) |
| *H01L 51/00* | (2006.01) |
| *H01L 51/52* | (2006.01) |
| *H01L 27/32* | (2006.01) |

(52) U.S. Cl.
CPC ..... *H01L 29/78606* (2013.01); *H01L 27/3244* (2013.01); *H01L 51/003* (2013.01); *H01L 51/0097* (2013.01); *H01L 51/524* (2013.01); *H01L 51/5253* (2013.01); *H01L 2251/5338* (2013.01); *H01L 2251/566* (2013.01); *Y02E 10/549* (2013.01)

(58) Field of Classification Search
CPC .......... H01L 29/78606; H01L 27/3244; H01L 51/003; H01L 51/0097; H01L 51/524; H01L 51/5253
USPC ........................................... 257/40
See application file for complete search history.

(56) References Cited

U.S. PATENT DOCUMENTS

2011/0260180 A1    10/2011   Kuranaga et al.

FOREIGN PATENT DOCUMENTS

| JP | 2007-317671 A | 12/2007 |
|---|---|---|
| JP | 2011-227369 A | 11/2011 |
| JP | 2013-186984 A | 9/2013 |

OTHER PUBLICATIONS

Examiner's Notice of Reason for Rejection issued by KIPO on Jun. 21, 2016, regarding Korean Patent Application No. 10-2015-0033699, with Partial English Translation.

*Primary Examiner* — Matthew Gordon
(74) *Attorney, Agent, or Firm* — Typha IP LLC

(57) ABSTRACT

A display device is provided including a first substrate comprising a resin material provided with a plurality region provided with a plurality of pixels including a display device, and a second substrate provided facing the first substrate and installed with the pixel region, wherein an outer periphery side surface of the first substrate having a taper shape and including a barrier layer covering an upper layer, lower layer and the outer periphery side surface of the first substrate.

15 Claims, 16 Drawing Sheets

DISPLAY DEVICE INCLUDING TAPERED SUBSTRATE

CROSS REFERENCE TO RELATED APPLICATIONS

This application is based upon and claims the benefit of priority from the prior Japanese Patent Application No. 2014-071652, filed on Mar. 31 2014, the entire contents of which are incorporated herein by reference.

FIELD

The present invention is related to a display device and one embodiment of the disclosed invention is related to a sealing structure of a panel in the display device.

BACKGROUND

An organic electroluminescence device (referred to below as "organic EL device") is provided with an organic electroluminescence layer (referred to below as "organic EL layer") between an anode and cathode. Although the organic EL device emits light according to the amount of current flowing in the device, it is known that water or oxygen badly affects the organic EL device which degrades light emitting characteristics.

As a result, an organic electroluminescence display device (below referred to as "organic EL display device") formed with pixels using an organic EL device is usually provided with a structure in which a pixel region is sealed with a sealing material. Although various structures have been examined for the sealing structure of an organic EL display device, for example, a structure is known in which a sealing substrate is bonded facing a substrate provided with a pixel using an organic EL device.

The structure in which a substrate formed with an organic EL device is bonded with sealing substrate is similar to a liquid crystal display device in which a liquid crystal material is held between a pair of substrates. However, because an organic EL display device an image using the light emitted by an organic EL device, a back light is not required unlike in a liquid crystal display device and in principle it is possible to achieve a thin display panel. Furthermore, it is thought that it is possible to also realize a sheet shaped display panel (sheet display) by applying a resin film to a substrate formed with a device or a sealing substrate.

Even in the vase where a resin film is used as a substrate in an organic EL display device, a sealing structure is necessary in order to prevent degradation due to the effects of water on the organic EL device. Generally, a resin film has the property to allow water to pass through and also includes the property whereby water is easily included and once included is reradiated.

As a result, arranging a barrier layer on a resin film used as a substrate in an organic EL display device in order to prevent the infiltration of water has been examined. For example, in Japanese Laid Open Patent No. 2011-227369, an image display device is disclosed provided with a first substrate comprised from a curved transparent substrate and a resin film formed with a thin film transistor adhered to an upper layer of the first substrate, wherein the barrier layer is comprised form an inorganic layer which covers the surface, rear surface and side surface of the resin film.

However, since the structure of the end surface of the resin film has not been considered in the display device described in the patent document 1, the problem whereby barrier properties at the end surface are insufficient still remains. In addition, because a process for forming a double resin film layer is necessary, an increase in component costs and manufacturing costs is considered a problem.

When the end surface of a resin film is cut perpendicularly, it is possible that the end surface is not sufficiently covered by a barrier layer. In the case where a barrier layer is a thin film comprised from an inorganic material such as a silicon oxide layer or silicon nitride layer, the barrier layer is formed using a sputtering method or plasma CVD method. However, this type of thin film formed from an inorganic material is not always formed at a uniform thickness at the end surface perpendicular with the surface of the resin film.

In the case where the film thickness of the barrier layer at the end surface of the resin film is insufficient, water or oxygen enters the device from that part. On the other hand, when attempting to make the film thickness of the barrier layer at the end surface of the resin film thicker, the film thickness of the surface side the resin film increases, the flexibility of the film is lost and there is a danger that cracks appear in the barrier film when the resin film is bent.

Therefore, one embodiment of the present invention aims to provide a display device with a high level of reliability which prevents the infiltration of water or oxygen from the end surface of a substrate in a display device which uses a resin film as the substrate.

SUMMARY

According to one embodiment of the present invention, a display device is provided including a first substrate comprising a resin material provided with a plurality region provided with a plurality of pixels including a display device, and a second substrate provided facing the first substrate and installed with the pixel region, an outer periphery side surface of the first substrate having a taper shape and including a barrier layer covering an upper layer, lower layer and the outer periphery side surface of the first substrate.

DESCRIPTION OF EMBODIMENTS

The embodiments of the present invention are explained below while referring to the diagrams. However, the present invention can be realized by various different forms and should not be interpreted as being limited to the contents described in the embodiments exemplified below. In addition, although the width, thickness and shape of each part are sometimes displayed schematically compared to the actual form in the diagrams in order to clarify the explanation, these are just examples and should not limit the interpretation of the present invention. In addition, in the present specification and diagrams, the same symbols are applied to the same elements described previously in the diagrams and a detailed explanation is sometimes omitted where appropriate.

In the present specification, there is no particular limitation in the case where certain parts or regions are [above (or below)] other parts or regions, and this applies not only when directly above (or directly below) other parts or regions but also includes cases when in an upper (or lower) direction of other parts or regions, that is, other structural components may be included between the other upper (or lower) parts or regions.

[First Embodiment]
<Display Device<

The structure and manufacturing method of the display device relayed to one embodiment of the present invention is explained while referring to the diagrams. In the present embodiment, a display device which forms a pixel is explained in the case where is an organic EL device as one form of a display device 100.

Figure 1:
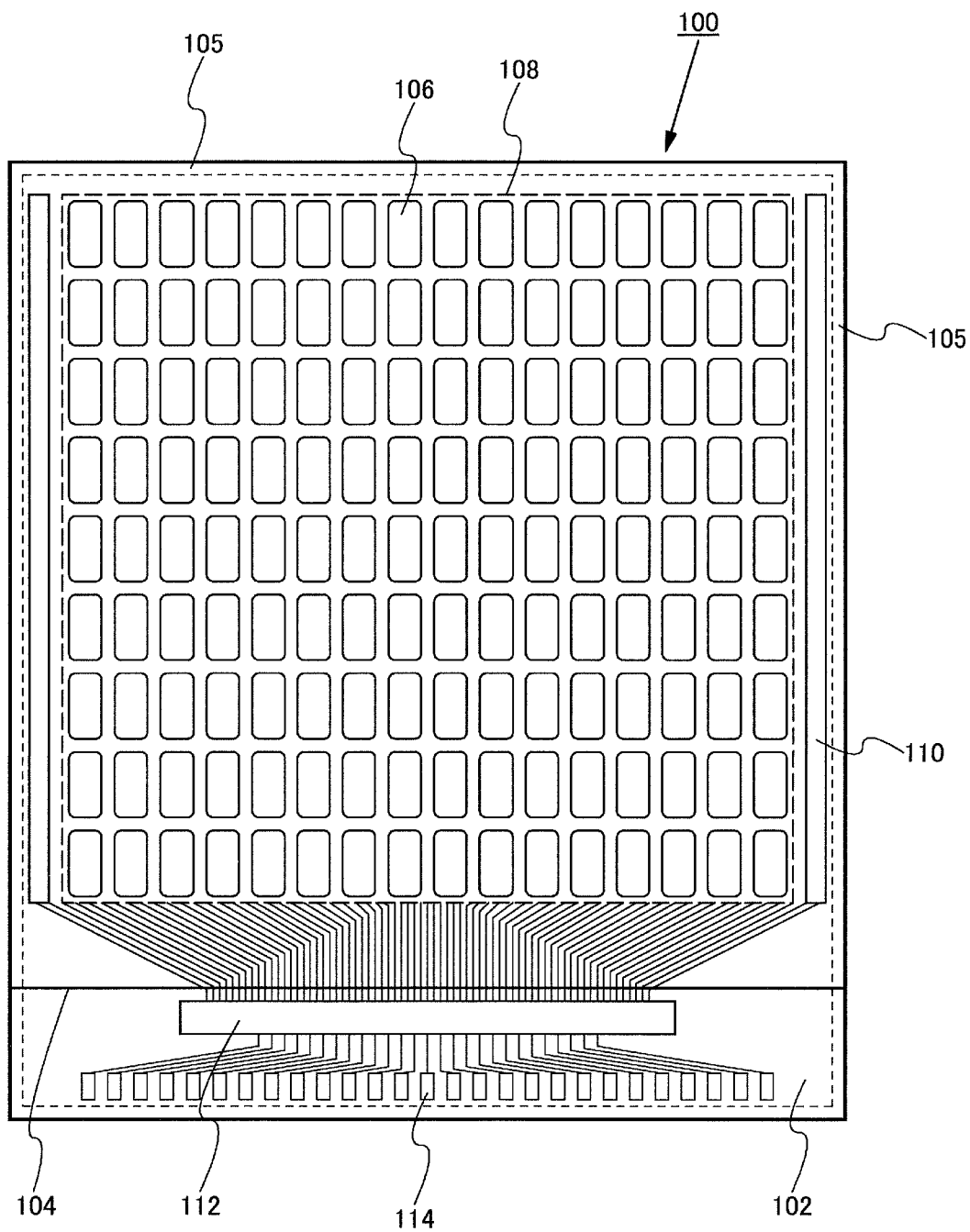
FIG. 1 is a planar diagram showing the structure of a display device related to one embodiment of the present invention.

FIG. 1 shows the structure of a display device 100 related to one embodiment of the present invention. The display device 100 is provided with a pixel region 108 in which a plurality of pixel are aligned in a first substrate 102. A second substrate 104 which is provided facing the first substrate 102 is provided so as to seal the pixel region 108. In the present embodiment, the first substrate 102 and second substrate 104 is preferred to be formed using a resin material, for example, a high molecular compound including an imide bond can be used and a polyimide resin can be suitably used.

The display device 100 may be provided with a first drive circuit which provides a scanning signal to the pixel region 108 and a second drive circuit 112 which provides a video signal, and the first substrate 102 may also be provided with an input terminal 114.

An end surface region 105 which is a region which includes a substrate surface in an outer periphery end part of the first substrate 102 has a tape shape. This taper shape has a thickness which gradually increases towards an inner region (towards the surface provided with the pixel region 108) from an outer end part of the first substrate 102. The pixel region 108 provided above the first substrate 102 is provided further to the interior than the end surface region 105.

The first substrate 102 is provided with a cover film which prevents water (or water vapor) from attaching or entering the first substrate 102 including the end surface region 105. In the explanation below, this cover film is referred to as a "barrier film" or "barrier layer". The barrier layer which covers the first substrate 102 is formed using an inorganic material. It is preferred that a material having insulation properties is used as the inorganic material and the barrier layer can be formed using one or a plurality of insulation films. In addition, in the case where the barrier layer is formed using a plurality of cover films, a metal film may also be included as one type of cover film.

<Manufacturing Process>

Figure 2:
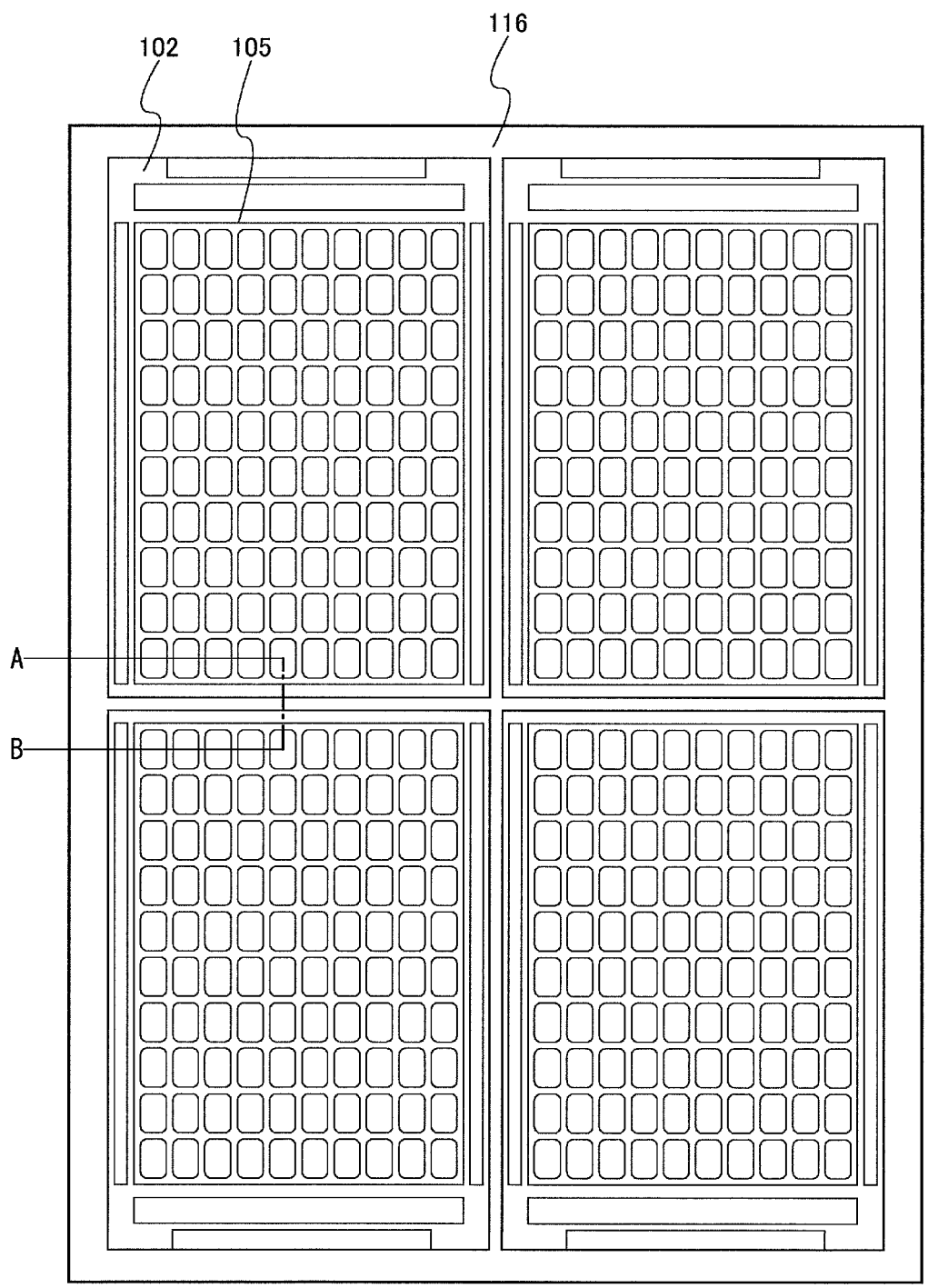
FIG. 2 is a planar diagram explaining the manufacture process of a display device related to one embodiment of the present invention.

Next, the display device 100 is explained in detail while referring to the manufacturing process. FIG. 2 is a planar diagram which shows the arrangement of a plurality of first substrates 102 provided with the pixel region 108. FIG. 2 shows one example of multi-patterning a plurality of display panels from a large area mother glass substrate. In addition, the cross-sectional structure along the cut line A-D shown in FIG. 2A is shown in FIG. 3A~3D and FIG. 4A~4C. Furthermore, FIG. 3A~3D and FIG. 4A~4C are diagrams explaining the manufacturing process of the display device shown in the present embodiment.

FIG. 2 shows an example whereby a plurality of substrates 102 are provided above a support substrate 116. The support substrate 116 is shown in the case of a mother glass substrate and shows multi-patterning a plurality of display panels.

The pixel region 108 is provided in the first substrate 102. In addition, as is shown in the diagram, a first drive circuit 110 and second drive circuit 112 may also be provided in addition to the input terminal 114. A second substrate 104 which seals the pixel region 108 is provided above the first substrate 102 and lastly the display device is completed after the first substrate 102 is peeled from the support substrate 116. This manufacturing process is explained below while referring to FIG. 3A~3D and FIG. 4A~4C.

Figure 3A:
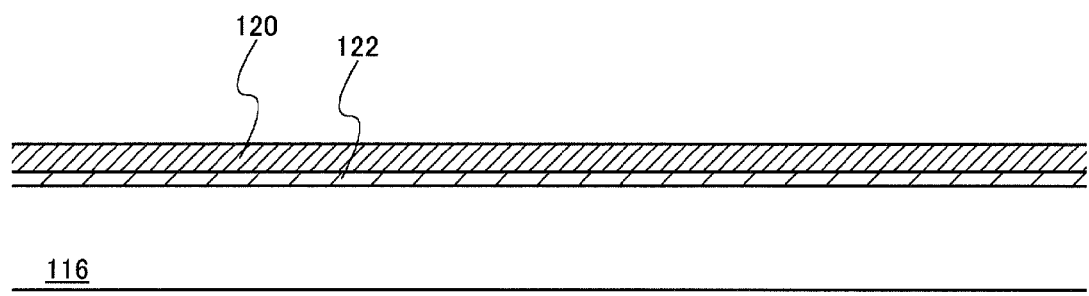
FIG. 3A~3D are cross-sectional diagrams explaining the manufacture process of a display device related to one embodiment of the present invention.

FIG. 3A shows the stage of forming a first barrier layer 122 and resin layer 120 on roughly the entire surface above the support substrate 116. The first barrier layer 122 is formed using an inorganic material. For example, a thin film using silicon nitride, silicon oxide, silicon oxynitride or aluminum oxide is formed using a sputtering method or plasma CVD method. Although there is no limitation to the thickness of the first barrier layer 122, for example, 50 nanometers or more and 1000 nanometers or less and 100 nan-meters or more and 500 nanometers of less is preferred. It is possible to prevent the transmission of water (or water vapor) by setting the film thickness of the first barrier layer 122 within this range.

Furthermore, in order for the first barrier layer 122 to be peeled from the support substrate 116 together with the first substrate 102, it is preferred that the first barrier layer 122 be a cover film with a weak adhesion compared to the support substrate 116. That is, the first barrier layer is preferred to be able to be peeled from the first substrate 102. As another form, a component (referred to below as [peeling layer]) which can be peeled may also be provided between the first barrier layer 122 and the support substrate 116. The structure of this peeling layer is described herein.

The first substrate 102 which forms the display device 100 is preferred to include translucency with a transparency ratio in the visible light band (wavelength of 400 nan-meters to 800 nanometers) of 80% or more and more preferably 90% or more. In order to achieve this, the resin layer 120 provided above the support substrate 120 is formed using a resin material that can obtain the optical characteristics described above. It is preferred that a resin material selected from polybenzoxazole, polyamidimide including an alicyclic structure, polyimide including an alicyclic structure, polyamide and polyxylylene be used as the resin material and these resin materials may be include independently or a plurality of these resin may be combined.

The thickness of the resin layer 120 is for example 1 micrometer or more and 100 micrometers or less, preferably 3 micrometers or more and 30 micrometers or less and more preferably 5 micrometers or more and 15 micrometers or less. By adopting this type of thickness, it is possible to provide flexibility as wee; as mechanical strength to the first substrate 102.

Figure 3B:
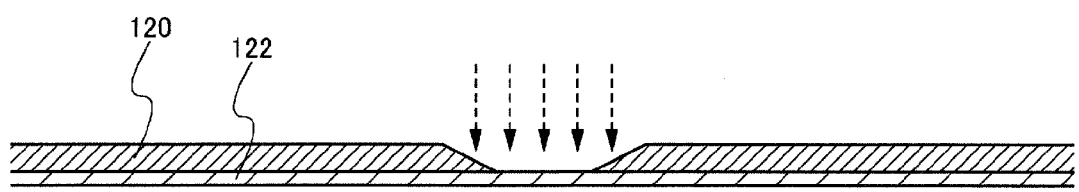

FIG. 3B shows the step of forming the first substrate 101 by removing a part of the resin layer 120. This stage can also be referred to as a step of forming the outer periphery side surface of the first substrate 102 into a taper shape.

Although there is no limitation to the processing method for removing unnecessary parts of the resin layer 120, for example it is possible to use a laser processing technology. In order to selectively process the resin layer 120 it is preferable to use an infrared laser, for example it is possible to use a LD pumped solid-state laser with a third harmonic wave (355 nanometers).

In order to process the outer periphery side surface of the first substrate 102 and obtain an end surface with a taper shape, it is sufficient to appropriately adjust the irradiation strength and beam profile of the laser beam which is irradiated when processing. For example, the energy of the beam spot may be set as a gauss distribution, setting the energy density at the center part high and the energy density at the periphery parts low in order to remove the resin layer 120. In addition, a laser beam with different beam intensities may be irradiated multiple times in order to control the thickness of the resin layer which is processed.

In either case, the outer periphery side surface of the first substrate 102 is preferred to be processed in order to obtain a taper shape in which the thickness increases gradually towards the inner side from the outer end. The angle of this taper shape is 60 degrees or less, preferably 45 degrees or less and more preferably 30 degrees or less using the surface of the support substrate 116 as a reference. In addition, the taper surface at the outer periphery side surface of the first substrate 102 may also have a curved surface shape.

Figure 3C:
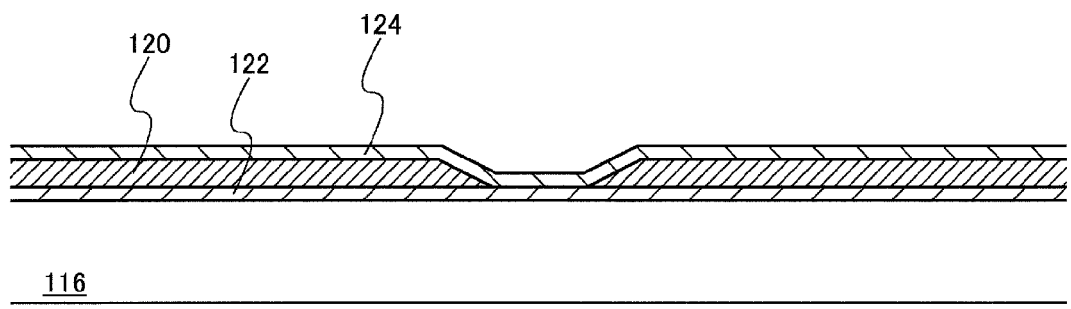

FIG. 3C shows the step of forming a second barrier layer 124. The second barrier layer 124 is provided so as to cover the upper surface part and outer periphery side surface of the first substrate 102. The second barrier layer 124 is preferred to be provided so as to adhere to the first barrier layer 122 exposed by removing the resin layer 120. That is, the second barrier layer 124 is preferred to be provided continuously from the upper surface part and outer periphery side surface of the first substrate 102 to the upper surface part of the first barrier layer 122. Furthermore, the second barrier layer 124 may be formed in the same way as the first barrier layer 122.

In this case, it is possible to sufficiently cover the end part of the first substrate 102 with the second barrier layer 124 by making the outer periphery side surface of the first substrate 102 into a taper shape. In the case where the outer periphery side surface of the first substrate 102 is a perpendicular surface, it is not possible to sufficiently cover that perpendicular surface using the second barrier 124. That is, the film thickness of a barrier layer at the perpendicular end surface of the first substrate 102 is thin, a pin hole is formed and the barrier properties are lost when cracks appear. However, by making the outer periphery side surface of the first substrate 102 into a taper shape, it is possible to for the second barrier layer 124 to cover this end surface and maintain the barrier properties with respect to water and oxygen.

In the processes up to FIG. 3C, it is possible to obtain a form whereby the lower layer side, upper layer side and outer periphery side surface of the first substrate 102 is enclosed by a barrier layer. In addition, in the region in which the resin layer 120 is removed, it is possible to arrange a part in which the second barrier layer 124 and first barrier layer 122 are adhered to the outer end part of the first substrate 102 when removing the first substrate 102 from the support substrate and extracting a display panel by adopting a structure in which the second barrier layer 124 and first barrier layer 122 are adhered. In this way, the end surface region of the first substrate 102 becomes sealed and it is possible to prevent water or oxygen from entering.

Figure 3D:
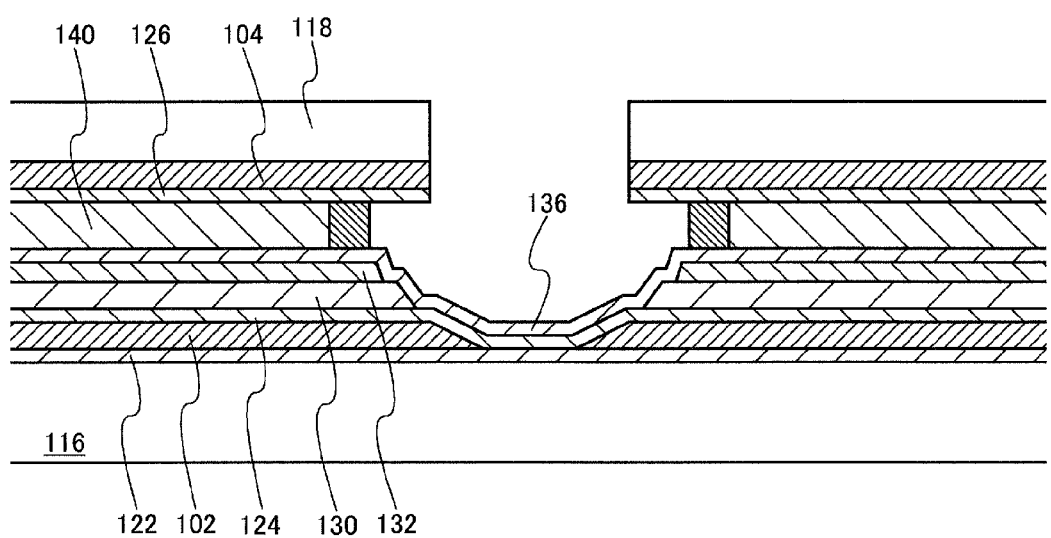

FIG. 3D shows a structure in which a first device layer 130 including a circuit device such as a transistor and a second device layer 132 including an organic EL device etc. are formed above the first substrate 102 formed with second barrier layer 124. In the present embodiment, there is no particular limitation to the structure of the first device layer 130 and the second device layer 132. For example, a wiring layer or an interlayer dielectric provided between wires may also be included in the first device layer 130 including a semiconductor layer formed with a transistor, a gate insulating layer and gate electrode layer etc. In addition, an organic EL layer which forms an organic EL device, an electrode layer sandwiching the organic EL layer, and a bank layer which encloses the organic EL device may also be included in the second device layer 132.

A passivation layer 136 may also be provided on an upper layer of the second device layer 132. The passivation layer 136 is the same as the first barrier layer or second barrier layer and is preferred to be formed using silicon nitride for example.

The passivation layer 136 covers the side surface part from the upper surface part of the second device layer 132 and the side surface part of the first device layer and is preferred to be provided so that the outer side region is in close contact with second barrier layer 124. In this case, the end part of the first device layer 130 is preferred to be located in a region further to the interior than the outer periphery side surface of the first substrate 102 and the end part of the second device layer 132 is preferred be located further to the interior than an end part of the first device layer 130 forming a step structure. In addition, the side surface parts of the first device layer 130 and the second device layer 132 are preferred to slant in a taper shape in each layer. By adopting this form, the side surface parts of the first device layer 130 and the second device layer 132 can be sufficiently covered by the passivation layer 136.

FIG. 3D shows the state in which the second substrate 104 is provided facing the first substrate 102 and is fixed by a sealing material. The second substrate 104 is formed using a resin material the same as the first substrate 102 and a third barrier layer 126 is provided over the surface of the second substrate 104. In FIG. 3D, the second substrate 104 is in a state supported by a second support substrate 118 and a filler material 140 may be filled into an interval part formed using a sealing material 138. The filler material 140 is an arbitrary component and a resin for example may be used.

Figure 4A:
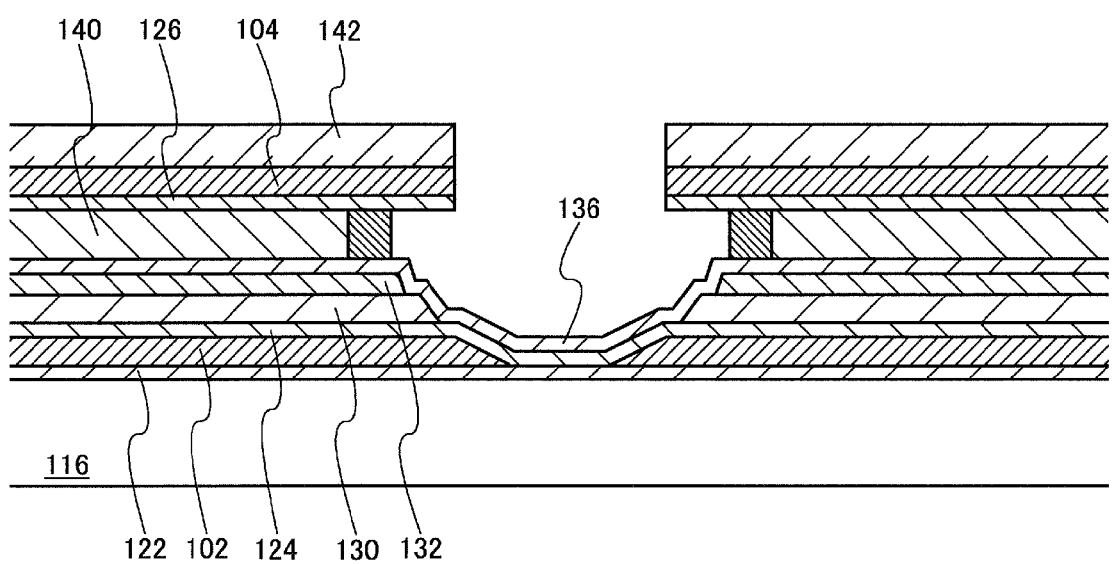
FIG. 4A~4C are cross-sectional diagrams explaining the manufacture process of a display device related to one embodiment of the present invention.

FIG. 4A shows a state in which a polarization plate 142 is provided after peeling the second substrate 104 from the second support substrate 118. A circular polarization plate is used as the polarization plate 142 and using this it is possible to prevent a display surface becoming a mirror and reflecting an external appearance. Furthermore, the polarization plate 142 is arbitrary and may or may not be provided appropriately.

Figure 4B:
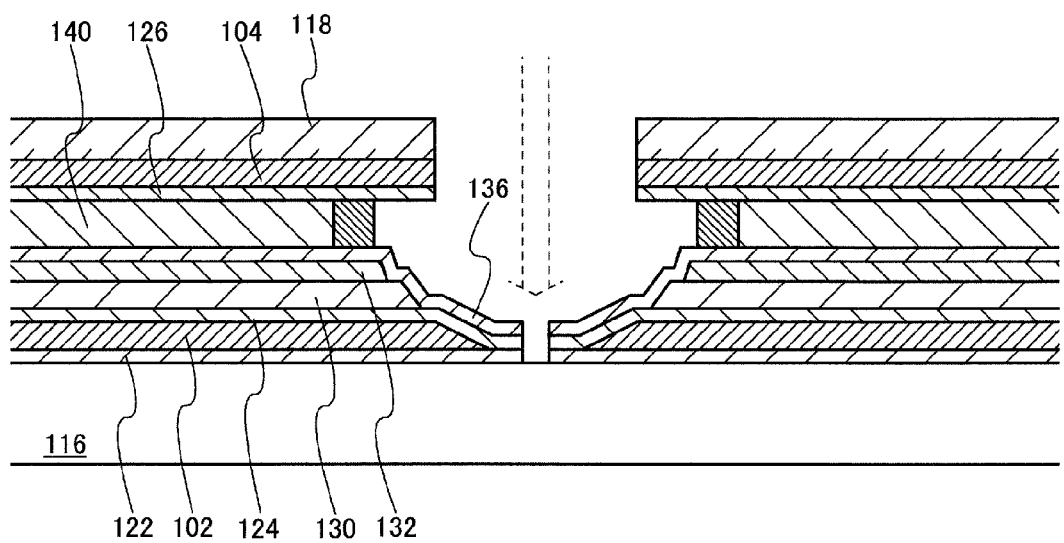

As is shown in FIG. 4B, the first barrier layer 122, second barrier layer 124 and passivation layer may be removed at the outer periphery part of the first substrate 102 in an outer side region of the first substrate 102 before peeling the first substrate 102 from the support substrate 116. By arranging in advance a separated region where the first barrier layer 122, second barrier layer 124 and passivation layer 136 are removed, these layers remain as barriers when the first substrate 102 is separated from the support substrate 116 and it is possible to prevent damage to the layers and a reduction in barrier properties of the end part region. Furthermore, it is preferred that a region remains where at least the first barrier layer 122 and second barrier layer 124 overlap in the outer side of the first substrate 102. Furthermore, removal of the first barrier layer 122, second barrier layer 124 and passivation layer 136 may be performed using a laser process for example.

Figure 4C:
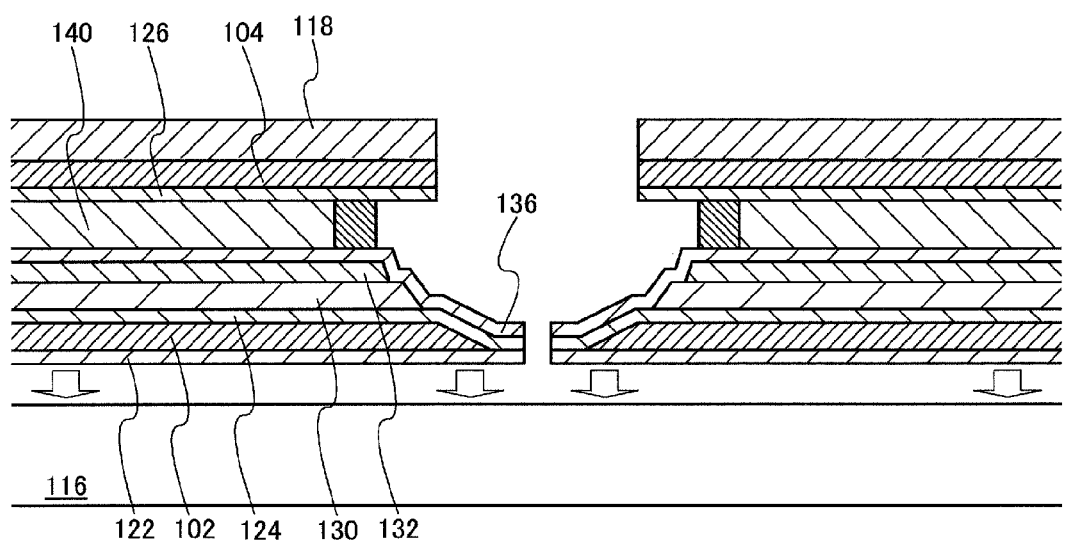

FIG. 4C shows a stage where the first substrate 102 is separated from the support substrate 116 (essentially, separated from the lower surface of the first barrier layer 122). In this way, the first substrate 102 becomes free from the support substrate 116 and it is possible obtain a sheet shaped display device. Furthermore, a thermal diffusion sheet may also be provided over the first substrate 102 side.

It is possible to use a number of methods in order to separate the first substrate 102 from the support substrate 116. An example of these methods is explained while referring to FIG. 5A-5C. All of the examples shown in FIG. 5A-5C show a method of arranging a peeling layer 134 between the support substrate 116 and the first barrier layer 122 and the first substrate 102 is separated from the support substrate 116 using the peeling layer 134.

Figure 5A:
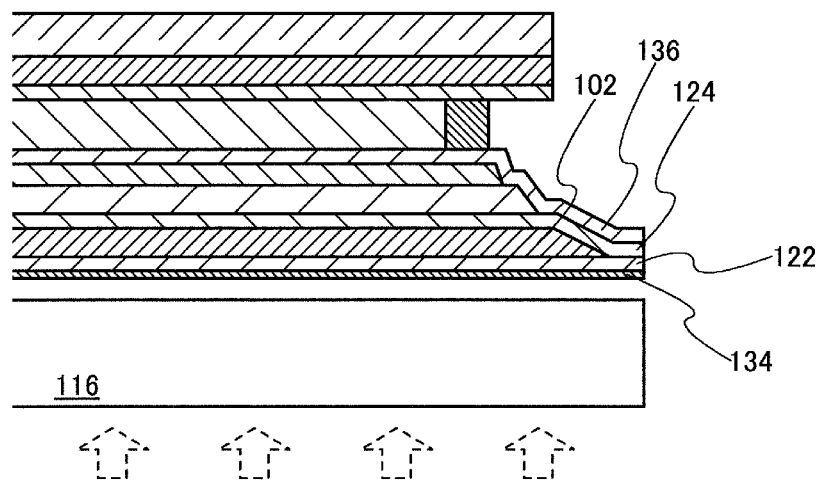
FIG. 5A~5C are cross-sectional diagrams explaining the manufacture process of a display device related to one embodiment of the present invention.

FIG. 5A shows an example where a resin material is used as the peeling layer 134. The resin layer comprised from a resin material is provided in advance between the support substrate 116 and the first barrier layer 122. For example, polyimide may be used as the resin material. The peeling layer 134 comprised from polyimide can be formed by coating a solution containing polyamic acid (one part including an imide modified polyamic acid) which is a polyimide precursor, or soluble polyimide above the support substrate 116 and sintering.

In order to perform peeling, an infrared light beam is irradiated from the support substrate 116 side which is a glass substrate and the adhesion at the boundary between the peeling layer 134 which is a resin material and the support substrate 116 is reduced. That is, when an infrared light beam is irradiated, the bond between polyimide and glass is broken and by partially removing the organic component, the adhesive strength of the peeling layer is reduced. Using this property it is possible to separate the first substrate 102 from the support substrate 116. According to this method, because the peeling layer 134 is also a resin material the same as the first substrate 102, the consistency of the manufacturing process is high.

Figure 5B:
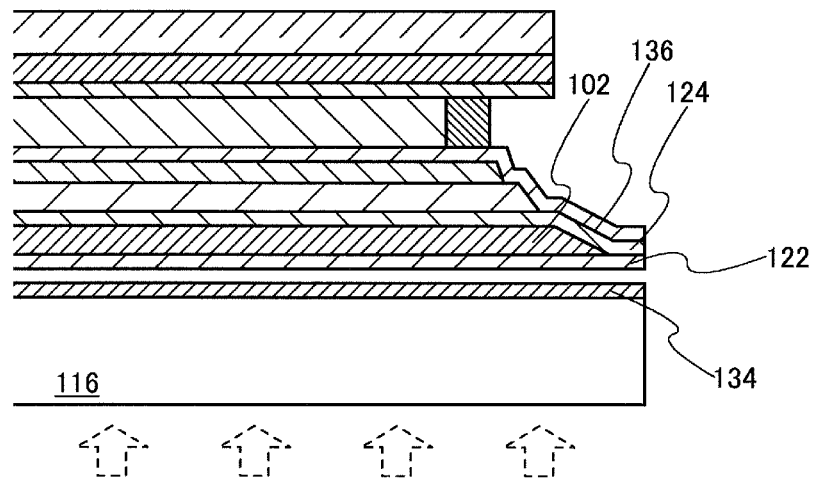
Figure 5C:
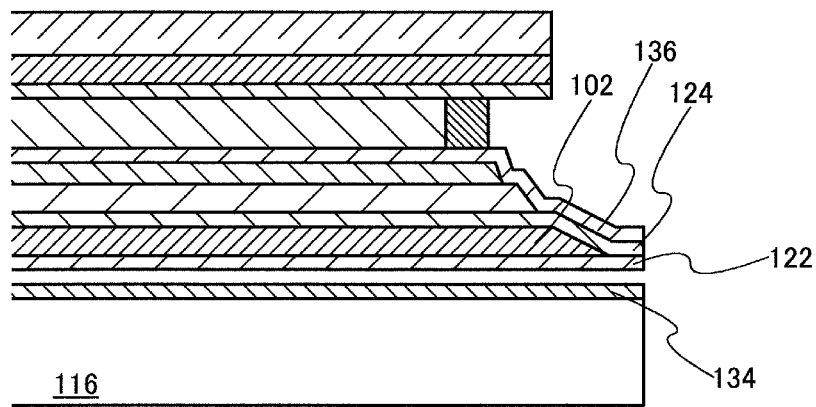

FIG. 5B shows an example of using an amorphous thin film including hydrogen as the peeling layer 134. It is possible to use a hydrogenated amorphous silicon film for example as the amorphous thin film including hydrogen. A hydrogenated amorphous silicon film is formed in advance as the peeling layer 134 between the support substrate 116 and the first barrier layer 122, a laser beam is irradiated onto the hydrogenated amorphous silicon film in the peeling process and instantly heated. A large amount of hydrogen is instantly released from the hydrogenated amorphous silicon film by heating, and due to an accompanying rise in pressure and change in the hydrogenated amorphous silicon film, the adhesion between the support substrate 116 or the first barrier layer 122 is reduced and it is possible to separate the first substrate 102 from the support substrate 116. It is possible to form the hydrogenated amorphous silicon film on a large area using a film formation method such as plasma CVD method and because the film formation is simple it is possible to form the peeling layer relatively easily.

FIG. 5C shows an example of using a metal film as the peeling layer 134. In this method, thermal stress is applied between a metal film provided as the peeling layer 134 and the first barrier layer 122 formed from a different material, stress is applied due to the difference in stress and peeling is performed. That is, peeling is performed by applying stress to a boundary of stacked layers having different materials with different thermal characteristics.

In either case, by providing the first barrier layer 122 when separating the first substrate 102 from the support substrate 116, it is possible to prevent damage to the first substrate 102. The peeling method shown in FIG. 5A~FIG. 5C can also be applied when peeling the second substrate 104 from the support substrate 118 in FIG. 4A.

As explained while referring to FIG. 2, FIG. 3A~FIG. 3D and FIG. 4A~FIG. 4C, according to the present embodiment, it is possible to obtain a display device using a simple process using the first substrate 102 and second substrate 104 which are formed from a resin material as a material. Since the first substrate 102 and second substrate 104 are either 100 micrometers or less, a sheet shaped display or flexible display can be realized.

It is possible to prevent water or oxygen in the air from entering the first substrate 102 by enclosing the upper layer side, lower layer side and outer periphery side surface taper surface of the first substrate 102 with a barrier layer. In this way, it is possible to prevent water or oxygen from dispersing to the first device layer including a transistor or the second device layer including an organic EL device, prevent corrosion of wiring or electrodes and prevent deterioration of an organic EL device.

By removing corrosion or deterioration as described above, it is possible to prevent point defects or line defects in a display screen of a display device, prevent variation in light emitting brightness and improve reliability.

<Details of the Display Device>

Figure 6:
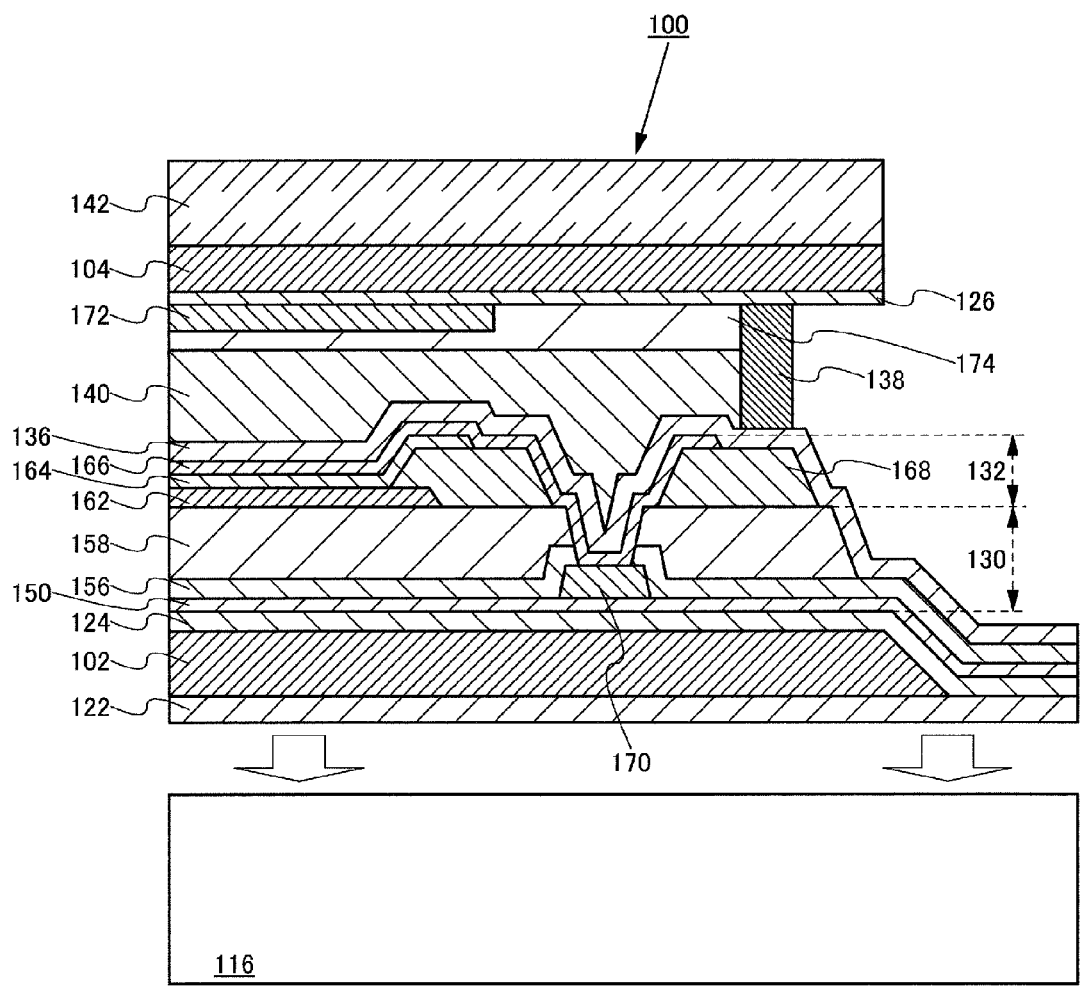
FIG. 6 is a cross-sectional diagram explaining the structure of a display device related to one embodiment of the present invention.
Figure 7:
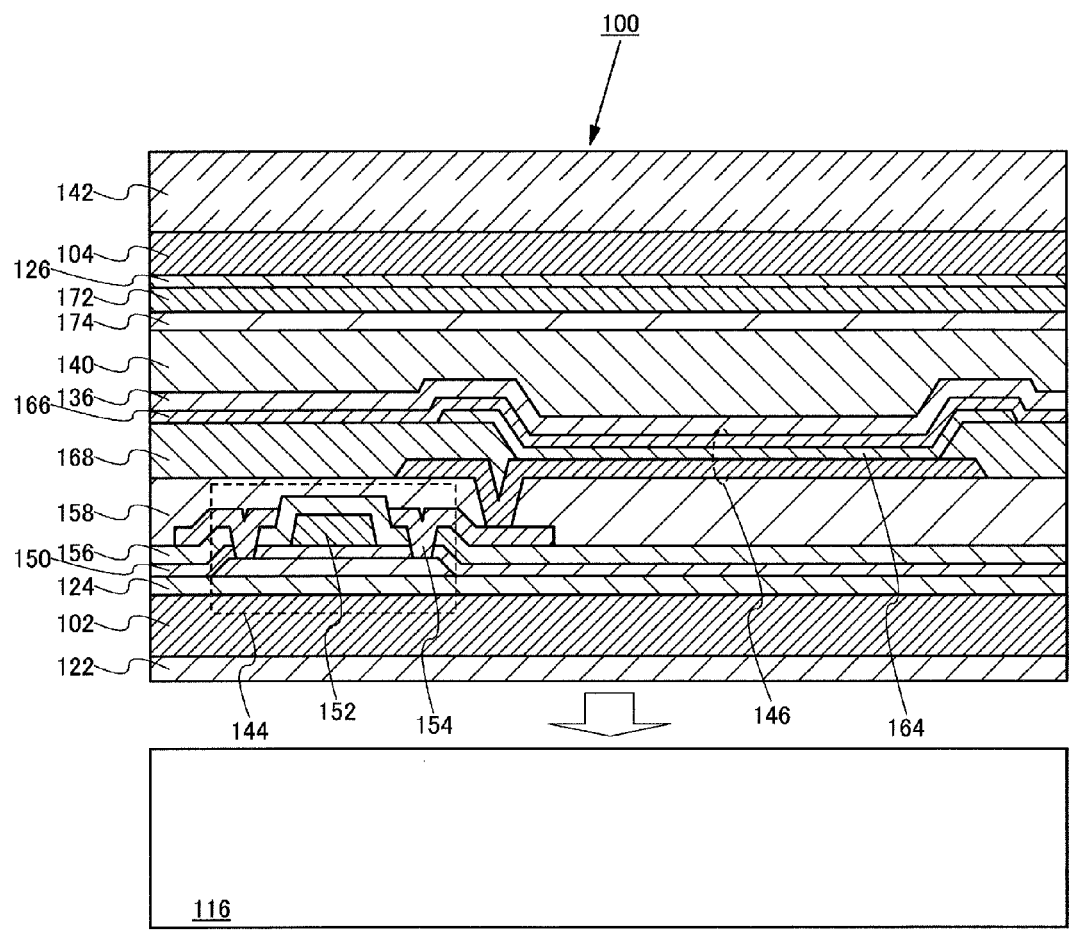
FIG. 7 is a cross-sectional diagram explaining the structure of a display device related to one embodiment of the present invention.

The details of the display device in the present embodiment are explained using FIG. 6 and FIG. 7. FIG. 6 shows the structure of a periphery part in the display device 100 and FIG. 7 shows the structure of an organic EL device 146 in a pixel 106 and a transistor 144 connected to the organic EL device 146. Both FIG. 6 and FIG. 7 are referred to in the explanation below.

The structure of the taper shape at the end part of the first substrate 102, and the structure of the barrier layer 122 over the lower layer side (lower surface side), and the structure of the second barrier layer 124 which covers the upper layer side (upper surface side) and the taper surface are the same as the explanation in FIG. 3C.

The first device layer 130 is provided above the second barrier layer 124. The device layer 130 is formed including a plurality of layers so that a transistor 144 is formed. The transistor 144 is formed including a semiconductor layer 148, a gate insulating layer 150 and a gate electrode 152. The gate insulating layer 150 which is provided between the semiconductor layer 148 and gate electrode 152 is provided above the first barrier layer 122 from the upper surface of the semiconductor layer 148 extending to the end surface region 105 of the first substrate 102 and the second barrier layer 124 is stacked at the taper surface. Since the gate insulating layer 150 is formed using a silicon oxide film and silicon oxynitride film, the film thickness of the barrier layer is essentially increased by stacking with the second barrier layer 124 at the taper surface.

Furthermore, although a top gate type structure is shown in FIG. 7 as the transistor 144, in the case of a bottom gate type structure, the stacking order of the semiconductor 148, gate insulating layer 150 and gate electrode 152 is reversed. However, there is no difference in the structure of the gate insulating layer 150 at the end surface region 105.

A first interlayer dielectric 156 is provided between the gate electrode 152 and a source/drain electrode 154 (in the present embodiment, [source/drain electrode] refers to an electrode connected with the source or drain of a transistor). The first interlayer dielectric 156 is also preferred to be provided extending to the end surface region 105 the same as the gate insulating layer 150 in the case where it is formed using an inorganic insulating material such as silicon oxide and is stacked with the second barrier layer 124. By stacking with the second barrier layer 124 at the taper surface of the end surface region 105, it is possible to essentially increase the film thickness of the barrier layer. The second interlayer dielectric 158 provided on an upper layer of the source/drain electrode 154 is preferred to be formed using a resin material such as polyimide or acrylic. Apart from the second interlayer dielectric 158 insulating an interlayer, the second interlayer dielectric 158 is provided with a thickness of 1 micro-meter to 5 micro-meters in order to perform planarization.

Furthermore, neither the gate insulating layer 150 and first interlayer dielectric 156 stacked with the second barrier layer 124 are required to be stacked, it is sufficient that at least one of the insulating layers is stacked.

In this way, a plurality of layers is included in the first device layer 130 and the transistor 144 is formed by this plurality of layers. In addition, a part of the layers included in the first device layer 130 is extends to the end surface region of the first substrate 102 and is preferred to be stacked with the second barrier layer 124.

The second device layer 132 is provided above the first device layer 130. An organic EL device 146 is included in the second device layer 132. The organic EL layer 146 includes a structure in which a pixel electrode 162, organic EL layer 164 and opposing electrode 166 are stacked. The pixel electrode 162 is provided in the second interlayer dielectric 158 and is connected to a source/drain electrode 154 of the transistor 144 via a contact hole. The end part of the pixel electrode 162 is covered by a bank layer 168 and the organic EL layer 164 is provided along the surface of the pixel electrode 162 and bank layer 168. The bank layer 168 is provided including a thickness of about 1 micro-meter to 3 micro-meters in order to prevent the organic EL device 146 shorting due to the step of the pixel electrode 162.

The organic EL layer 164 can be formed using a low molecular or high molecular organic material. In the case where a low molecular organic material is used for the organic EL layer 164, in addition to a light emitting layer which includes an organic material with light emitting properties, a carrier layer such as a hole transport layer or an electron transport layer may be provided to sandwich the light emitting layer. In addition, the organic EL layer 164 may emit light of each of the colors red (R), green (G) and blue (B), or emit white color light. In the case where the organic EL layer 164 emits white color light, it is possible to combine the organic EL layer 164 with a color filter and perform color display.

The opposing electrode 166 is an electrode common to a plurality of pixels and is provided on an upper layer of the organic EL layer 164. The opposing electrode 166 extends above the bank layer 166 and is connected to a common wire 170 which applies a common voltage on the outer side of the pixel region 108. FIG. 6 shows the case where the common wire 170 is formed on the same layer as the gate electrode 152 and shows the form where the common wire 170 and the opposing electrode 166 are connected via a contact hole which passes through the bank layer 168, second interlayer dielectric 158 and first interlayer dielectric 156.

The passivation layer 136 is provided to roughly cover the entire surface of the first substrate 102 over the upper layer side of the opposing electrode 166. The end surface region 105 of the first substrate 102 is also preferred to be covered by the passivation layer 136 and the end part taper surface is stacked with the second passivation layer 124, gate insulating layer 150, first interlayer dielectric 156 and passivation layer 136. Using the structure, it is possible to improve the barrier properties of the first substrate 102.

In this case, the end part of the second interlayer dielectric 158 is located further to the interior than the end surface region 105 of the first substrate 102 and the side surface part (end part) is also preferred to have a taper shape. In addition, the end part of the bank layer 168 is preferred to be located further to the interior than the end part of the second interlayer dielectric 158 and the end part is preferred to have a tape shape. The passivation layer 136 covers the side surface from the upper surface of the bank layer 168 and the side surface of the second interlayer dielectric and can be provided so as to cover the end surface region 105 of the first substrate 102. At this time, when the side surface part of the second interlayer dielectric 158 and the side surface part of the bank layer 168 are tapered surfaces and not perpendicular surfaces, it is possible to improve the cover properties of the passivation layer 136. In addition, by making the step formed by the second interlayer dielectric 158 and bank layer 168 provided to a thickness of a few micro-meters as described above into a step shape, it is possible to improve the cover properties of the passivation layer 136.

The second substrate is provided facing the first substrate 102 and is fixed by a sheet material 138. A third barrier layer 126 is provided over the surface of the second substrate 104 and a color filter 172 or overcoat layer 174 may be provided in the pixel region 108.

According to the present embodiment, by adopting this type of structure it is possible to enclose not only the first substrate 102 but also the second interlayer dielectric 159 formed from a resin material and the bank layer 168 using a cover layer formed from an inorganic material. In this way, it is possible to block each layer formed from a resin material forming the display device 100 from being exposed to the air and prevent water (water vapor) or oxygen in the air from entering the inside of a display panel, prevent corrosion of wiring or electrodes and prevent deterioration of the organic EL device 146.

Furthermore, in the present invention, the display device which uses an organic EL device may be a bottom emission type which irradiates light to the first substrate side or a top emission type which irradiates light to the opposing substrate side.

In addition, the present invention is not limited to a display device. The organic EL device can be provided on roughly one surface between the first substrate and second substrate and can also be applied to a lighting device.

Furthermore, although the case where an organic EL device is used as a display device is shown in the present embodiment, the present invention is not limited to an organic EL device and the same effects can be obtained by using a liquid crystal device as the display device. The liquid crystal device includes a structure in which a liquid crystal layer is inserted between a pixel electrode and an opposing electrode. In the present embodiment, it is possible to obtain a liquid crystal display device by adopting a structure in which a liquid crystal layer is provided above the pixel electrode 162 and sandwiching this light crystal layer using the second substrate 104 provided with an opposing substrate. An orientation layer which defines the orientation of the liquid crystals or a color filter in the second substrate 104 may also be appropriately provided. In the case where the structure of the barrier layer in the present embodiment is applied to a liquid crystal display device, moisture resistance of the first substrate 102 and second substrate 104 can be improved and reliability can be improved.

[Second Embodiment]

Figure 8:
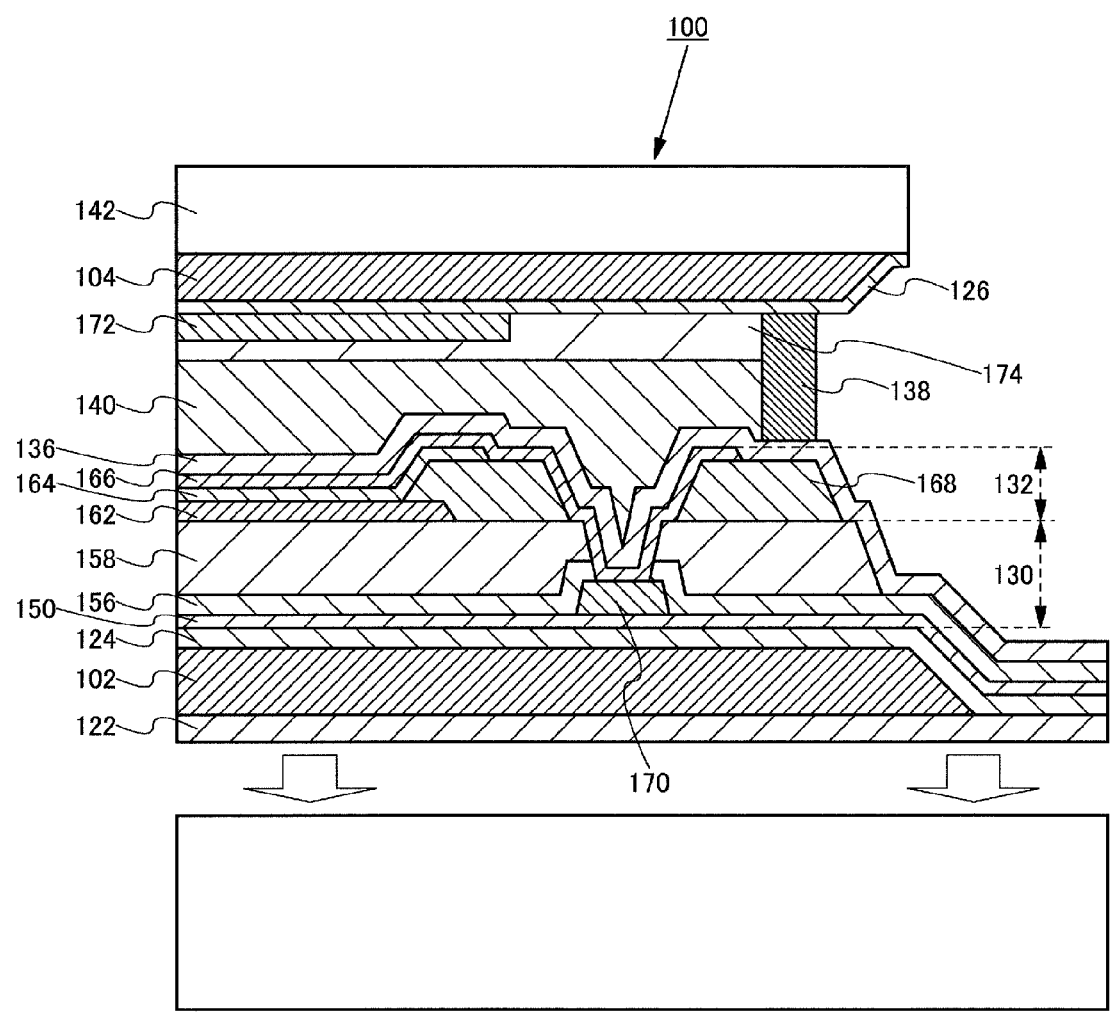
FIG. 8 is a cross-sectional diagram explaining the structure of a display device related to one embodiment of the present invention.

The structure of the display device related to one embodiment of the present invention is shown in FIG. 8. Since the structure of the display device shown in FIG. 8 is the same as the first embodiment apart from the second substrate 104, only the parts which are different are explained.

In FIG. 8, the end part of the second substrate 104 has a taper shape the same as the first substrate 102. The third barrier layer 126 is provided so as to cover the surface and side surface of the second substrate 104. By adopting this structure, it is possible to cover the side surface part of the second substrate 104 using the third barrier layer 126 and prevent water from entering from the side surface part.

Since the structure of the first substrate 102 is the same as in the first embodiment it has the same effects as in the first embodiment and because a path blocking water from entering from the outer can be further obtained according to the present embodiment it is possible to further increase reliability of the display device.

[Third Embodiment]

Figure 9:
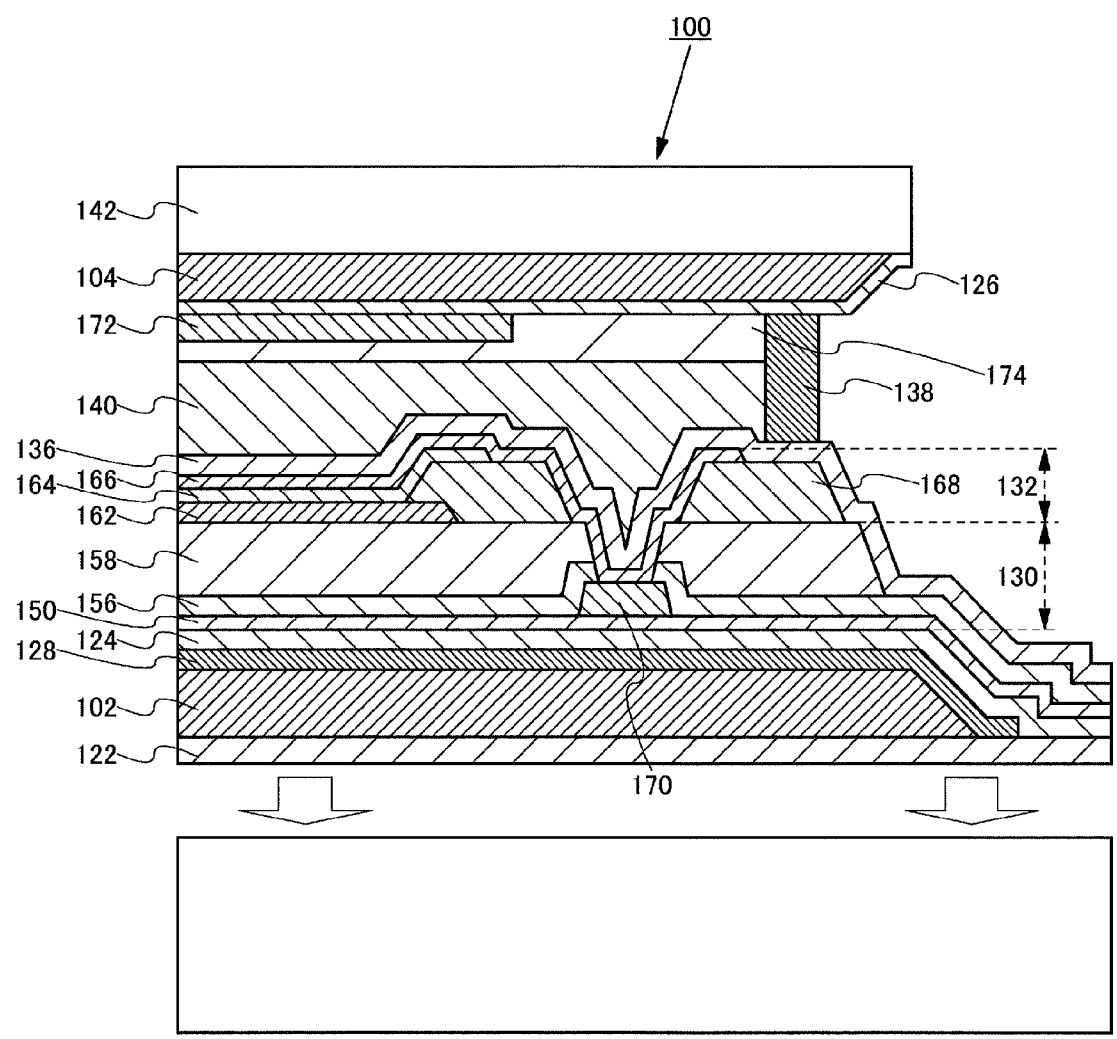
FIG. 9 is a cross-sectional diagram explaining the structure of a display device related to one embodiment of the present invention.

The structure of the display device related to one embodiment of the present invention is shown in FIG. 9. Apart from the structure of the first embodiment 102 being different, since the structure of the display device shown in FIG. 9 is the same as the structure described in the first and second embodiments, only the parts which are different are explained.

In FIG. 9, a fourth barrier layer 128 is provided between the first substrate 102 and the second barrier layer 124. While the first barrier layer 122 is provided using an inorganic material, the fourth barrier layer 128 is formed using a metal material. A cover film using a metal material can be suitably applied as a barrier layer since it has high water blocking properties. Although it is possible to use various metal materials, it is preferred that titanium (Ti) for example is used.

It is possible to increase barrier properties by stacking a plurality of layers comprised from different materials which have high barrier properties with respect to water as the barrier layer with respect to the first substrate 102.

In the case where the first barrier layer 122 is an inorganic insulation film such as silicon oxide or silicon nitride, while this inorganic insulation film is formed using a plasma CVD method, the metal film using titanium (Ti) can be formed using a sputtering method. In this way, by forming a barrier layer by combining a chemical vapor deposition method (CVD) which uses a chemical reaction and a physical vapor deposition method (PVD) which uses physical work such as sputtering, because it is possible to form a cover film on parts of one film which have pinholes even if pinholes are produced in the other film and eliminate the effects of defects, it is possible to improve the barrier properties of a barrier layer.

In addition, by arranging the fourth barrier layer 128 which is formed from a metal material on a lower layer of the first barrier layer 122 which is formed from an insulating material, because it is possible to widen the distance with a wiring layer included in the first device layer 130, it is possible to reduce the effects of parasitic capacitance.

In this way, apart from the fourth barrier layer 128, because it is possible to apply the structure of the first and second embodiments, it is possible to obtain the same effects and by adding a layer formed from a metal material as a barrier layer according to the present embodiment, it is possible to further improve the barrier properties against water or oxygen with respect to the first substrate 102.

Furthermore, the structure of the fourth barrier layer 128 shown in FIG. 9 may also be provided with respect to the second substrate 104. In this way, it is possible to further increase barrier properties in the second substrate 104.

What is claimed is:

1. A display device comprising:
   a first substrate comprising a resin material provided with a pixel region provided with a plurality of pixels;
   a second substrate provided facing the first substrate and installed with the pixel region; and
   an outer periphery side surface of the first substrate having a taper shape and including a first barrier layer covering a lower surface of the first substrate, and a second barrier layer covering an upper surface and the outer periphery side surface of the first substrate.

2. The display device according to claim 1,
   the second barrier layer contacts the first barrier layer around the outer periphery side surface of the first substrate.

3. The display device according to claim 1, each of the first and second barrier layers comprises an inorganic material.

4. The display device according to claim 3, wherein the inorganic material is at least one from among silicon nitride, silicon oxide, silicon oxynitride and aluminum oxide.

5. The display device according to claim 1, wherein a third barrier layer comprising a metal material is further provided between the first substrate and the second barrier layer.

6. The display device according to claim 5, wherein the first barrier layer and the second barrier layer contact an outer side region of the third barrier layer.

7. The display device according to claim 5, wherein the metal material is titanium.

8. The display device according to claim 1, wherein
   the second substrate is formed from a resin material,
   an outer periphery side surface of the second substrate having a taper shape, and
   a fourth barrier layer is included on a surface facing the outer periphery side surface and the first substrate.

9. The display device according to claim 1, wherein
   a passivation layer is included to cover the pixel region, and
   the passivation layer is provided extending as far as the outer periphery side surface of the first substrate and overlaps the second barrier layer on the outer periphery side surface.

10. The display device according to claim 2, wherein
    the pixel region includes a transistor, the transistor includes a semiconductor layer forming a channel, a gate electrode and a gate insulating layer between the semiconductor layer and gate electrode, a source-drain electrode contacts a source or drain of the transistor via a first interlayer dielectric provided on an upper surface of the gate electrode, and either one or both of the gate insulating layer and first interlayer dielectric is provided extending as far as the outer periphery side surface of the first substrate and overlaps the second barrier layer on the outer periphery side surface.

11. The display device according to claim 10, wherein a second interlayer dielectric, a pixel electrode above the second interlayer dielectric, an organic electroluminescence device stacked with an organic electroluminescence layer and opposing electrode, a bank layer covering an end part of the pixel electrode, and a bank layer above the opposing electrode are provided on an upper layer of the first interlayer dielectric; and the passivation layer extends to the outer periphery side surface of the first substrate, and the passivation layer, the gate insulating layer, the first and second interlayer dielectrics and the second barrier layer are stacked on the outer periphery side surface of the first substrate.

12. The display device according to claim 11, wherein a part of the second interlayer dielectric and the bank layer includes a taper shape, and the passivation layer is provided along an end part of the bank layer extending as far as the outer periphery side surface of the first substrate.

13. The display device according to claim 1, wherein an end part of the second interlayer dielectric is provided further to the interior than the outer periphery side surface of the first substrate, and the end part of the bank layer is provided further to the interior than the end part of the second interlayer dielectric.

14. The display device according to claim 1, wherein a stacked layer of the passivation layer, the gate insulating layer, the interlayer dielectric, and the bank layer extend to the outer periphery side surface of the first substrate.

15. The display device according to claim 1, wherein the display device is an organic electroluminescence device or liquid crystal device.

* * * * *